(12) United States Patent
Proell et al.

(10) Patent No.: US 7,110,310 B2
(45) Date of Patent: Sep. 19, 2006

(54) RAM STORE AND CONTROL METHOD THEREFOR

(75) Inventors: Manfred Proell, Dorfen (DE); Stephan Schroeder, Munich (DE); Ralf Schneider, Munich (DE); Joerg Kliewer, Munich (DE)

(73) Assignee: Infineon Technologies AG, Munich (DE)

(*) Notice: Subject to any disclaimer, the term of this patent is extended or adjusted under 35 U.S.C. 154(b) by 239 days.

(21) Appl. No.: 10/762,280

(22) Filed: Jan. 23, 2004

(65) Prior Publication Data

US 2004/0233747 A1 Nov. 25, 2004

(30) Foreign Application Priority Data

Jan. 23, 2003 (DE) ................................ 103 02 650

(51) Int. Cl.
*E03D 1/02* (2006.01)
(52) U.S. Cl. ...................... 365/205; 365/203
(58) Field of Classification Search ................ 365/205, 365/203, 222, 207, 202
See application file for complete search history.

(56) References Cited

U.S. PATENT DOCUMENTS 5,894,444 A * 4/1999 Seyyedy ..................... 365/205
6,301,175 B1 * 10/2001 Seyyedy et al. ............. 365/203
6,504,777 B1 * 1/2003 Hsu et al. .................... 365/205
2001/0015928 A1 8/2001 Fujioka et al.
2002/0051393 A1 5/2002 Taito et al.

* cited by examiner

*Primary Examiner*—Gewne N. Auduong
(74) *Attorney, Agent, or Firm*—Slater & Matsil, L.L.P.

(57) ABSTRACT

The invention relates to a RAM store having a shared SA structure, in which sense amplifiers (SA) arranged in SA strips (10) between two respective adjacent cell blocks are used by a plurality of bit line pairs (21, 22; 21–24) from the adjacent cell blocks and the bit line pairs (21, 22; 21–24) have respective charge equalization circuits individually associated with them for the purpose of performing charge equalization between the bit line halves of the bit line pairs (21, 22; 21–24) in a precharge phase, where a shorting transistor (30) is provided which, when prompted by a control signal (EQLx), connects the bit line halves (BLT, BLC) of the bit line pairs (21, 22; 21–24) which are in the precharge phase to one another. The shorting transistor (30) is arranged in or on the respective sense amplifier (SA) jointly for all bit line pairs (21, 22; 21–24) which can be connected to a repetitive sense amplifier (SA), and it can be switched by a separate shorting control signal (EQLx) via a dedicated control line (9).

17 Claims, 5 Drawing Sheets

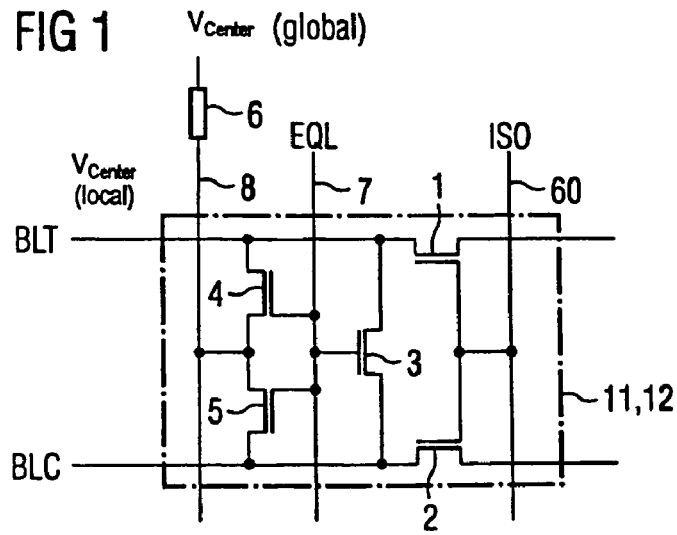
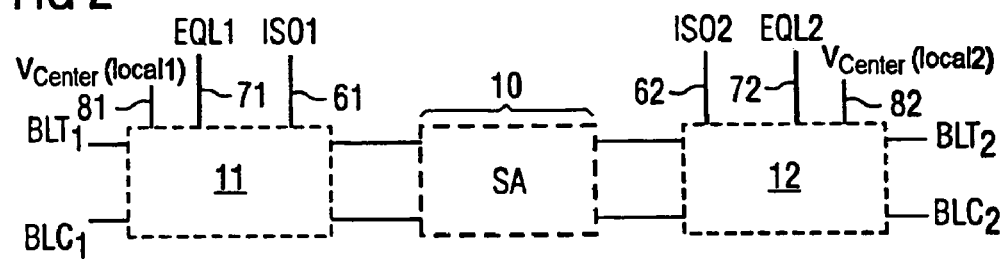
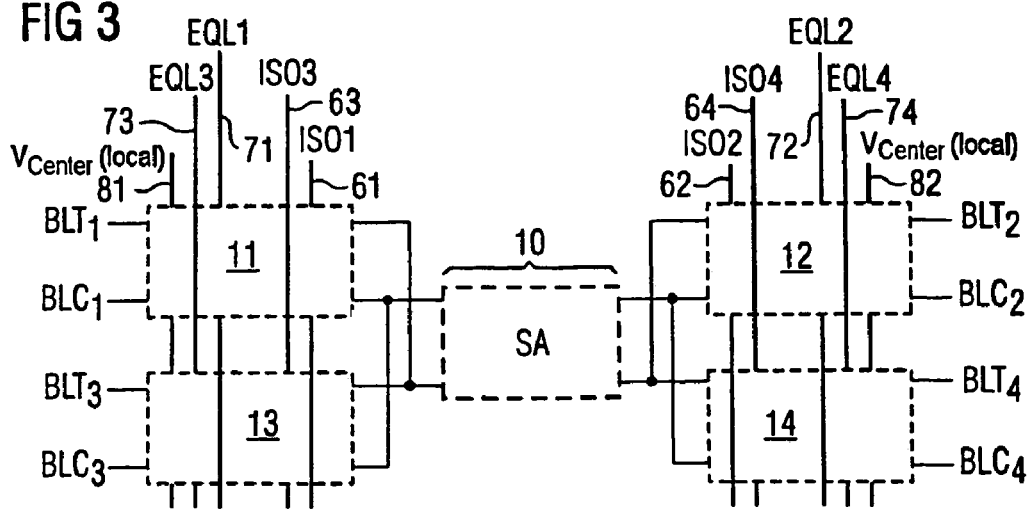

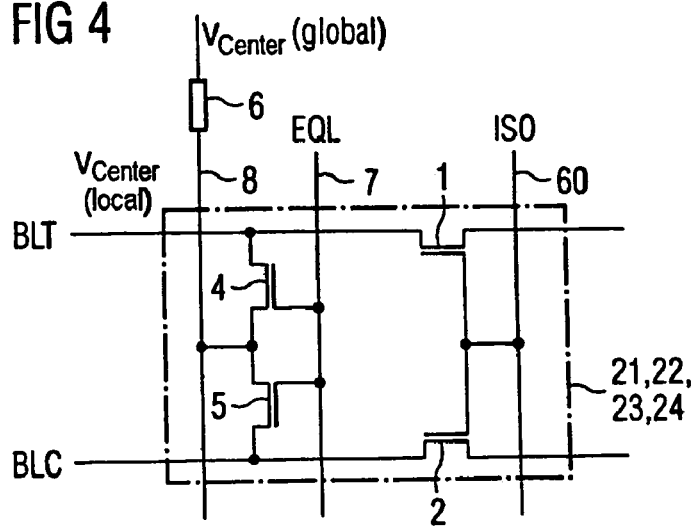
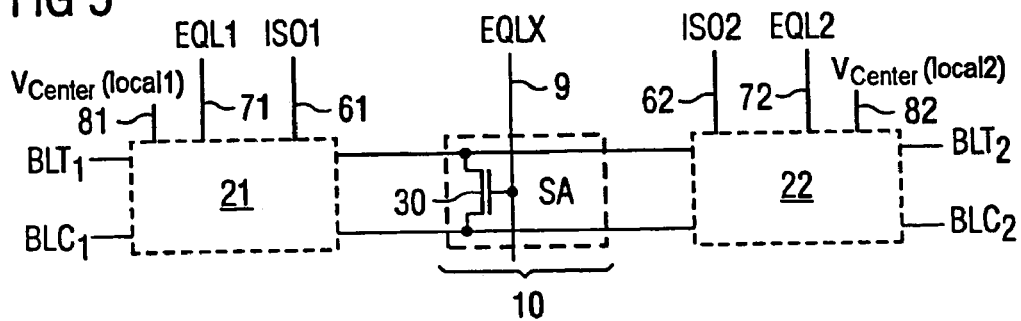
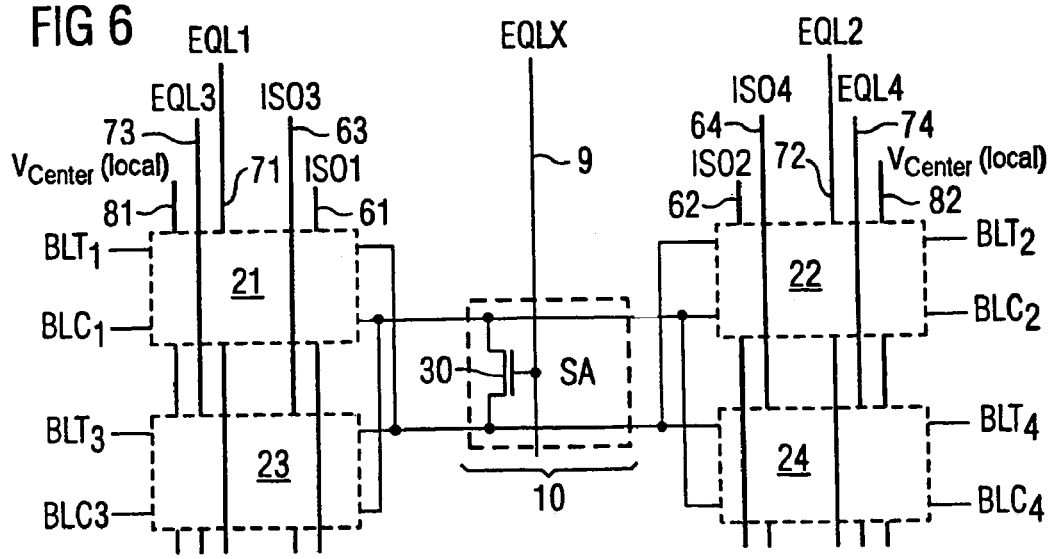

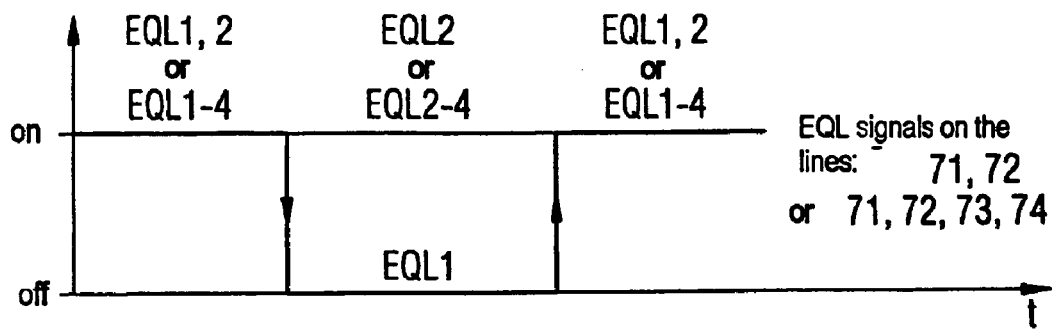
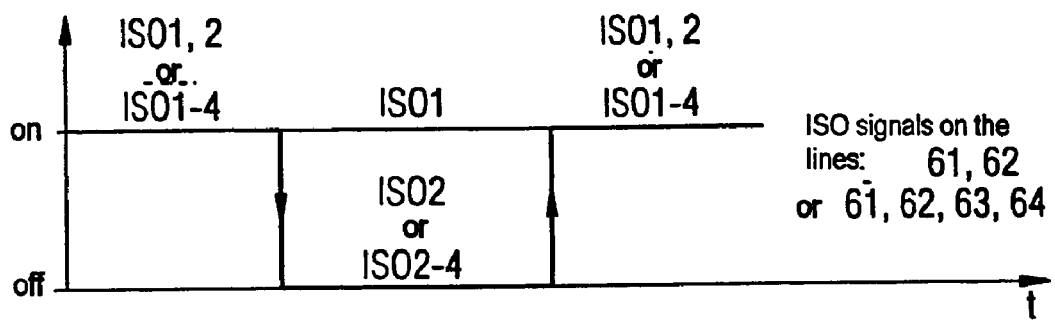
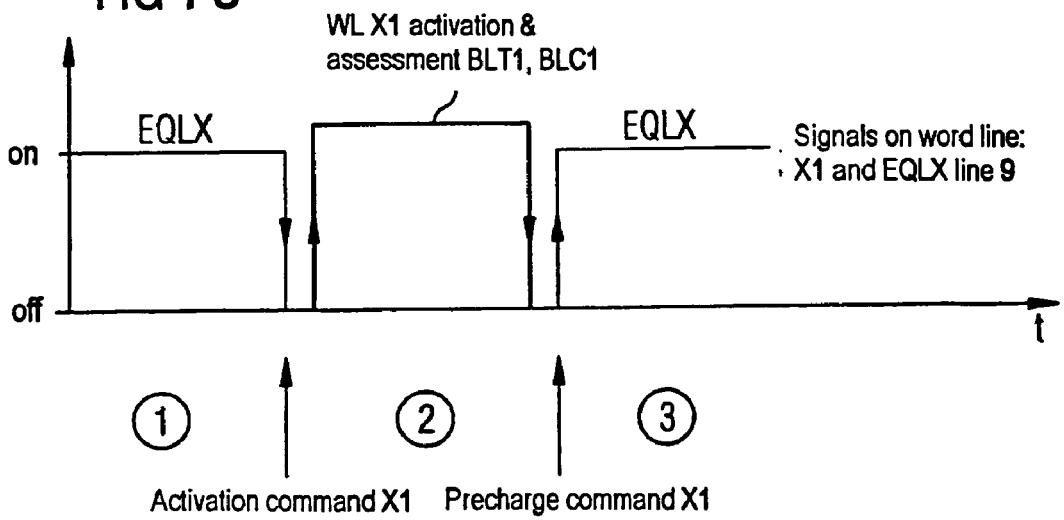

RAM STORE AND CONTROL METHOD THEREFOR

BACKGROUND

1. Field of the Invention

The invention relates to a RAM store having a shared SA structure and to a control method for such a RAM store.

2. Background Information

In dynamic semiconductor memory chips (DRAMs), the bit line (BL) signals are assessed using sense amplifiers (SAs) that are connected to the right and left of a bit line pair. This "shared SA" design results in a surface-area-optimized sense amplifier array, which normally has half the repetition rate of the bit line pairs, in a sense amplifier strip situated between two adjacent cell blocks.

With reference to the appended FIGS. 1 and 2, a description is given of a known circuit arrangement for connecting two bit line pairs 11, 12, which each comprise complementary bit line halves (BLT, BLC), to a sense amplifier SA situated in a sense amplifier strip 10 between the cell blocks and of the circuit arrangement for charge equalization which is to be performed for the bit line halves BLT, BLC in a precharge phase and also of the aforementioned shared SA structure. First, FIG. 1 shows the arrangement of the control elements for a bit line pair 11, 12. An isolation transistor pair 1, 2 is turned on by a connection control signal (ISO) supplied via an Iso line 60 in order to connect a respective bit line pair to the sense amplifier SA. A charge equalization circuit has two drift equalization transistors 4, 5 and a shorting transistor 3. In response to a charge equalization signal EQL supplied via a control line 7, firstly the shorting transistor 3 shorts the two bit line halves BLT and BLC and secondly the drift equalization transistors connect the two bit line halves BLT and BLC to a predetermined center level Vcenter (local). This local center level Vcenter (local) is delivered by a voltage generator Vcenter (global) via a current limiter 6 and a supply line 8, whose purpose will be explained later.

As FIG. 2 shows, the circuit and control elements shown in FIG. 1 exist and can be controlled individually for each bit line pair. In this regard, the charge equalization control signals for the two bit line pairs 11 and 12 connected to the sense amplifier SA are respectively denoted by EQL1 (line 71) and EQL2 (line 72) in FIG. 2. Equally, the connection control signals for the left-hand bit line pair 11 and for the right-hand bit line pair 12 have the designations ISO1 and ISO2 (lines 61 and 62).

The center level Vcenter (local) on the supply lines 81 and 82 is the voltage which establishes itself after the spread or assessed bit line halves BLT, BLC have been shorted by the shorting transistor 3. The drift equalization transistors 4, 5 ensure that any leakage paths which may exist cause the center potential to be maintained on the two bit line halves BLT and BLC. Since the drift equalization transistors 4, 5 thus compensate merely for leakage currents, they are generally of significantly smaller design than the transistor 3 which shorts the bit line halves BLT, BLC. By contrast, the length of the precharge time is determined essentially by the shorting transistor 3 and hence by its size and current yield.

Reference is now made to the currently submitted patent application from the same applicant entitled "RAM-Speicher" [RAM store] (attorney's file 12366; official file reference not yet known), in which an SA uses four bit line pairs.

Such a shared SA design is shown schematically in the appended FIG. 3. As can be seen, the connection control signals (ISO1, ISO2, ISO3, ISO4) supplied to the isolation transistor pairs 1, 2 via the lines 61–64 can in this case connect four bit line pairs 11, 12 and 13, 14 to a sense amplifier SA. The circuit structure for the individual bit line pairs 11–14 can have the arrangement explained above as shown in FIG. 1. As can be seen, the control signals routed to the shorting transistors 3 and to the drift equalization transistors 4, 5 of the individual bit line pairs 11, 14 are denoted by EQL1–EQL4 (control lines 71–74) and the supply lines supplying the center level Vcenter are denoted by 81 and 82 in FIG. 3.

In addition, today's DRAM semiconductor memory chips have redundant memory elements which can replace faulty bit lines (or word lines) in order to optimize the efficiency of such DRAM semiconductor memory chips. Specifically in the case of bit line repair, today's repair designs are in a form such that one bit line pair (for example 11) associated with the sense amplifier can be repaired, that is to say replaced by a redundant bit line pair, by using this bit line address to access a redundant element in the same word line activation block, while the other bit line pairs, for example 12–14 associated with the same sense amplifier SA are used as previously.

If, by way of example, a bit line pair now has a short to a fixed potential (for example VSS) and is therefore replaced by an operational redundant bit line pair, this means that the further bit line pairs associated with the sense amplifier on which the replaced bit line pair, which is still shorted to VSS, is situated can be affected. Since the charge equalization activated in the precharge phase has every bit line, even repaired ones, connected to the same center level generator Vcenter (global), it is necessary to ensure that a bit line pair which is stuck at VSS (0 volt), for example, as a result of a short does not continue to load the center level generator Vcenter unnecessarily, or even influence its voltage, after it has been replaced by a redundant bit line pair. For this reason, as FIG. 1 shows, the current limiters 6 for each individual bit line repair unit are incorporated in the center level supply. The current limiters 6 thus generate the local center level Vcenter (local), which normally corresponds to the normal center level Vcenter (global), per bit line repair unit (for example a bit line pair). For the case of a faulty bit line, for example stuck at VSS, which has therefore been replaced, the current limiter 6 decouples the local center voltage Vcenter (local) from the global network and prevents the latter from being overloaded.

A problem arises with the normal DRAM semiconductor memory structure in that a bit line pair which is stuck at VSS and repaired affects the performance of the further, unrepaired bit line pairs linked to the same sense amplifier SA in another way during the precharge phase. In the precharge phase, despite the local center level for the faulty and intact bit line pairs being decoupled, the center level is influenced via the isolation transistors 1, 2, which are on in the precharge case. That is to say that the bit line pair (e.g. 11) originally at center level is connected via the isolation transistors associated with the two bit line pairs to the level of the faulty bit line pair, which unfortunately does not have the correct center level. Although the current limiter 6 for the intact bit line pair 11 prevents feedback to the center level network, all the further bit line pairs which are at the local center level Vcenter (local) of the intact bit line pair are influenced by the faulty bit line pair in the same way.

It will now be assumed that, in a subsequent phase, a memory cell situated on the intact bit line pair (for example 11) is selected by a word line. On account of the center level (which the faulty bit line has shifted toward VSS) on the intact bit line pair (for example 11), the signal swing for a memory cell which has been loaded with VSS ("0") and is connected to the intact bit line pair 11 becomes increasingly smaller, and the correct recognition of the information in the memory cell by the sense amplifier is made more difficult. Similarly, the recognition of a "1" at a center level shifted toward VCC is made more difficult. In addition, the sense amplifier does not operate at its regular operating point, which can result in slower recognition of the information or in reduced sensitivity of the sense amplifier.

SUMMARY

A RAM store is disclosed having a shared SA structure in which circuit surface area for the shorting transistors can be saved and which can therefore be packed closer together. As a result, problems relating to intact bit line pairs linked to a common sense amplifier being influenced by a faulty bit line pair that has been replaced by a redundant bit line pair is avoided. A control method which is suitable for a RAM store is also disclosed.

A RAM store having a shared SA structure is disclosed. The RAM store comprises sense amplifiers (SA) arranged in SA strips between two respective adjacent cell blocks for use by a plurality of bit line pairs from the adjacent cell blocks, wherein the bit line pairs have respective charge equalization circuits individually associated with them for the purpose of performing charge equalization between bit line halves of the bit line pairs in a precharge phase. The RAM store also includes a shorting transistor that, when prompted by a control signal, connects the bit line halves of the bit line pairs that are in the precharge phase to one another, wherein the shorting transistor is arranged in or on the respective sense amplifier jointly for all bit line pairs.

A method is also disclosed for controlling a RAM store having the design of a shared SA structure, in which sense amplifiers arranged in SA strips between two respective adjacent cell blocks are respectively used by a plurality of bit line pairs from the adjacent cell blocks. A connection control signal is generated separately for each of the bit line pairs associated with the same sense amplifier for connecting the sense amplifier to the respective bit line pair actuated by the connection control signal. A precharge control signal also is generated for performing charge equalization between the bit line halves of the bit line pairs associated with the same sense amplifier in a precharge phase. The bit line halves of the bit line pairs associated with the same sense amplifier are shorted, when these bit lines pairs are in the precharge phase on account of the precharge control signal supplied to them, by means of a shorting transistor arranged in or on each sense amplifier, and this is done by supplying this shorting transistor with a dedicated shorting control signal.

Aspects of the invention are explained in more detail below with reference to diagrammatic drawings on the basis of preferred exemplary embodiments.

BRIEF DESCRIPTION OF THE DRAWINGS

FIG. 1 schematically shows a control circuit for a bit line pair, as already described in the introduction;

FIG. 2 shows a schematic block diagram of a shared SA structure, where two bit line pairs can be connected to the same sense amplifier (already described in the introduction);

FIG. 3 shows a schematic block diagram of a shared SA structure, where four bit line pairs from two adjacent cell blocks can be connected to a single sense amplifier;

FIG. 4 schematically shows an inventive control circuit for a respective bit line pair;

FIG. 5 shows a schematic block diagram of a shared SA structure using a section from a first exemplary embodiment of an inventive RAM store, where two bit line pairs from adjacent cell blocks use a common sense amplifier;

FIG. 6 schematically shows a block diagram of a section from a second exemplary embodiment of an inventive RAM store having a shared SA structure, where four bit line pairs from two adjacent cell blocks use a common sense amplifier;

FIGS. 7A, 7B, 7C show three signal timing diagrams to explain a first exemplary embodiment of a control method for an inventive RAM store as shown in FIG. 5 or 6;

DETAILED DESCRIPTION

Figure 8A:
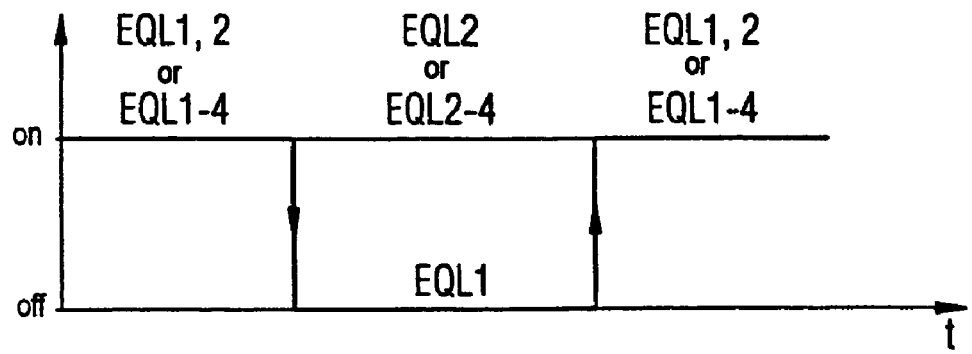
FIGS. 8A, 8B, 8C show three signal timing diagrams to explain problems which arise when connecting a plurality of bit line pairs to a common sense amplifier in a conventional DRAM store provided with redundant bit line pairs.

In the following Figures, the same reference symbols always designate the same structures or elements, and the corresponding detailed descriptions are not repeated in any case. A list of reference numerals is provided below:

| | |
|---|---|
| 1, 2 | Isolation transistor pair |
| 3, 30 | Shorting transistor |
| 4, 5 | Drift equalization transistors |
| 6 | Current limiter |
| 7, 71–74 | Precharge control line EQL, EQL1–EQL4 |
| 8, 81, 82 | Potential line for center potential Vcenter (local) |
| 9 | Shorting control line EQLx |
| 10 | SA strip |
| 11–14; 21–24 | Bit line pairs |
| BLT, BLC | Complementary bit line halves |
| 60; 61–64 | Control lines for connection control signal ISO, ISO1–ISO4 |
| WLX1 | Word line with the X address X1 |

In the control circuit for bit line pairs 21–24 which is shown in FIG. 4 (cf. FIGS. 5 and 6), the previously explained shorting transistor 3 shown in FIG. 1 is no longer present. The other control elements, namely the isolation transistors 1, 2, the control line 60 supplying the connection control signal ISO, the drift equalization transistors 4, 5, which are arranged for each bit line half BLT, BLC of a bit line pair 21–24, the control line 7 supplying the precharge control signal EQL, and the supply line 8 supplying the center level Vcenter (local) and also the current limiter 6 are the same as in FIG. 1.

FIG. 5 shows a section from a first exemplary embodiment of an inventive RAM store, where two bit line pairs 21 and 22 controlled in line with FIG. 4 use the common sense amplifier SA which is situated in the sense amplifier strip 10. Unlike in RAM stores which have been customary to date (cf. FIGS. 1 to 3 described in the introduction), the shorting transistor 30 is now arranged in or on the sense amplifier SA, which is controlled by a separate shorting control signal EQLx applied via a line 9 which is routed in the SA strip.

Connection control signals ISO1, ISO2, precharge control signals EQL1, EQL2 and the center voltage Vcenter (local) are respectively supplied by control and supply lines 61, 71, 81 for the bit line pair 21 and also 62, 72 and 82 for the bit line pair 22. The bit line halves of the bit line pair 21 are denoted by BLT1 and BLC1 and those for the bit line pair 22 are denoted by BLT2 and BLC2.

FIG. 6 shows a section from a second exemplary embodiment of an inventive RAM store, where four bit line pairs 21–24 use the same sense amplifier SA, which is situated in the sense amplifier 10 and likewise has or contains the shorting transistor 30, as described previously with reference to FIG. 5. For the two bit line pairs 21, 23 in the left-hand cell block, the connection control signals ISO1, ISO3 are respectively supplied via control lines 61, 63 and the precharge control signals EQL1 and EQL3 are respectively supplied via control lines 71 and 73, while the center potential Vcenter (local) is supplied via the supply line 81.

Equally, the two bit line pairs 0.22, 24 in the right-hand cell block respectively receive the connection control signals ISO2 and ISO4 via control lines 62 and 64 and respectively receive the precharge control signals EQL2 and EQL4 via control lines 72 and 74, while the center potential Vcenter (local) is supplied via a supply line 82. The bit line halves of the four bit line pairs 21–24 are respectively denoted by BLT1, BLC1; BLT2, BLC2; BLT3, BLC3 and BLT4, BLC4.

In the first exemplary embodiment shown in FIG. 5, the invention aims to save a shorting transistor for two respective bit line pairs, while the exemplary embodiment shown in FIG. 6 saves three shorting transistors for four respective bit line pairs. The two exemplary embodiments of an inventive RAM store which have been described above with reference to FIGS. 4 to 6 are supplied with a separate shorting control signal EQLx via a control line 9 in order to switch all the shorting transistors 30 in all the SAs in a SA strip 10. The shorting control signal EQLx thus switches all the shorting transistors 30 in a SA strip 10.

FIGS. 7A, 7B and 7C use three signal timing diagrams to show an inventive control method for an inventive RAM store in the form shown in FIGS. 4 to 6 over three phases ①, ②, ③, which comprise an activation command and a subsequent precharge command, by way of example for the bit line pair 21. It should be noted that phase ① corresponds to phase ③. X1 activation (word line activation) of a memory cell situated on the bit line pair 21 is illustrated in phase ②.

Phase ①: None of the X addresses situated in the sense amplifier's area have been activated. All the isolation transistor pairs 1, 2 in the bit line pairs 21, 22 (FIG. 5) or 21–24 (FIG. 6) are on as a result of the control signal ISO1, ISO2 or ISO1–ISO4 applied to them; since the shorting transistor is closed owing to the signal EQLx, it can act on all the bit line pairs 21, 22 or 21–24; in addition, the drift equalization transistors 4, 5 connect all the bit line pairs to the center level generator (via the current limiter 6) owing to the precharge control signals EQL1, 2 or EQL1–4 applied to them.

Phase ②: The activation X1 of a word line selects a memory cell situated on the bit line pair 21. The deactivated precharge control signal EQL1 Isolates the bit line pair 21 from the center level generator. The other bit line pair 22 or the other bit line pairs 22–24 remain connected to the center level generator owing to the precharge control signals EQL2 or EQL2–4 applied to the respective drift equalization transistors 4, 5 which means that the center level on the bit line pairs 22 or 22–24 still continues to be prevented from dropping as a result of possible leakage currents. The deactivation of the connection control signals ISO2 or ISO2–4 means that the isolation transistors isolate the second bit line pair 22 or the second to fourth bit line pair 22–24 from the sense amplifier SA. For the bit line pair 21, the isolation transistors remain on as a result of the connection control signal ISO1; the shorting transistor is turned off by the low EQLx, which means that the bit line pair 21 can be assessed by the sense amplifier SA.

Phase ③: Following the precharge command for X1, the drift equalization transistors 4, 5 for the bit line pair 21 are connected to the center level generator again by the precharge control signal EQL1. At the same time, the low-impedance shorting transistor shorts the bit line pair 21 as a result of the actuation with the signal EQLx. The other bit line pairs 22 or 22–24, which are still at center level in this case, are likewise connected to the sense amplifier again via the isolation transistors 1, 2 of the second bit line pair 22 or of the second to fourth bit line pairs 22–24 (ISO2–4) and, for their part, speed up the charge equalization (precharge) for the bit line pair 21.

The text above has referred to FIGS. 7A, 7B and 7C to describe a first exemplary embodiment of an inventive control method for an inventive RAM store arranged with a shared SA structure as shown in FIGS. 4 and 5 or 4 and 6.

Figure 8B:
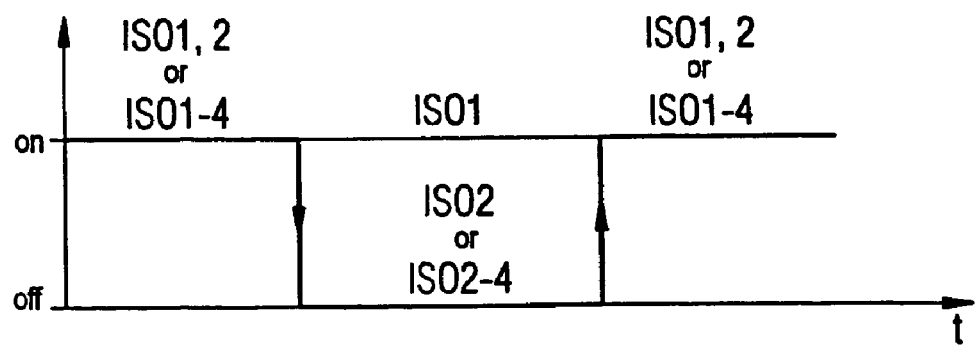
Figure 8C:
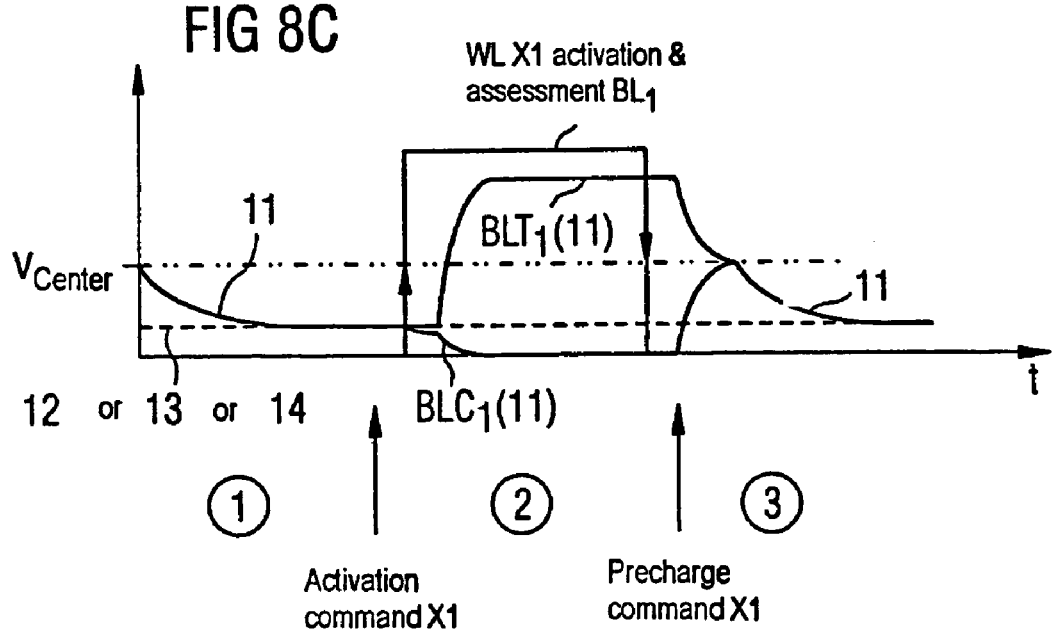

With reference to FIGS. 8A, 8B and 8C, which schematically show three signal timing diagrams for precharge and connection control signals in a conventional DRAM semiconductor memory circuit with a shared SA structure as shown in FIGS. 1 to 3, the influencing of the center level by a faulty bit line replaced by a redundant bit line is now explained in more detail. In this case, it will be noted that the signal timing diagrams in FIGS. 8A and 8B are identical to the signal timing diagrams described above in FIGS. 7A and 7B. Hence, reference is made primarily to FIG. 8C. It becomes clear in the actual precharge phase ① that, despite the local center level Vcenter, decoupled by the current limiter 6, of the bit line pairs 21, 22 or 21–24 using a single sense amplifier SA, the center level is influenced by means of the isolation transistors 1, 2, which are on in the precharge phase ①. Assumptions made are an intact bit line pair (for example 11) and a faulty bit line pair (for example 12 or 13 or 14), replaced by a redundant bit line pair, which is supposed to be stuck at the level VSS (0 volt) as a result of a short circuit. The intact bit line pair 11 originally at the center level Vcenter is connected to the wrong level of the faulty bit line pair via the isolation transistors 1, 2 either of the faulty bit line pair 12 or of a faulty bit line pair 12, 13, 14. Although the current limiter 6 for the intact bit line pair 11 is used to prevent feedback to the center level network, all the bit line pairs which are at the local center level of the bit line pair 11 are influenced by the faulty bit line pair (for example 12) in the same way.

Activation phase ②: In this phase, by way of example, a memory cell which is on the intact bit line pair 11 is selected by the word line X1 on the basis of the activation command. The center level (shifted toward VSS (0 volt)) of the bit line pair 11 means that the signal swing for a cell which is loaded with VSS ("0") and is connected to the bit line pair 11 becomes increasingly smaller, and the correct recognition of the cell information by the sense amplifier SA is made more difficult or impossible. Similarly, the recognition of a "1" with a center level shifted toward VCC would be more difficult or impossible. In addition, the sense amplifier SA does not operate at its regular operating point, which can result in slower sensing or in lower sensing sensitivity.

Phase ③ shows a fresh precharge, where the shorting transistor 3 (FIG. 1) for the bit line pair 11 initially equalizes the spread bit line pair 11 to the center level. After that, the bit line pair 11 is pulled back to the fixed VSS potential (0 volt) of the faulty bit line (for example 12) via the isolation transistors 1, 2.

Figure 9A:
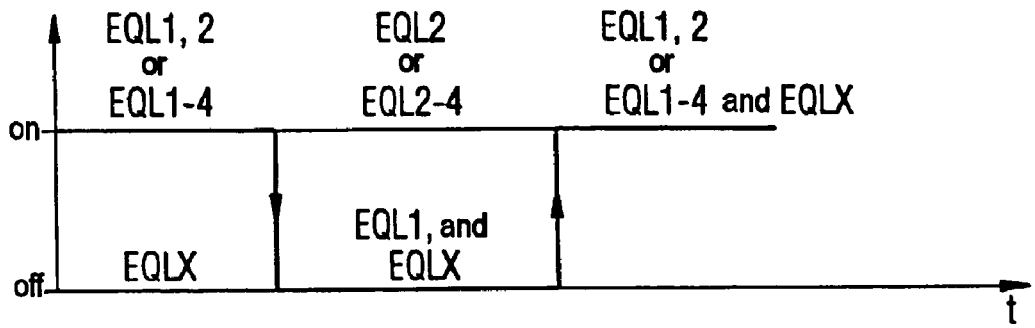
FIGS. 9A, 9B, 9C show three signal timing diagrams to explain a second exemplary embodiment of an inventive control method for an inventive RAM store as shown in FIG. 5 or 6 which is equipped with a redundancy function for faulty bit lines.

The inventive RAM store, where the shorting transistor 30 is situated not on the individual bit line pairs but rather in or on the sense amplifier SA instead and is actuated by a separate shorting control signal EQLx via the control line 9 routed in the SA strip 10, provides an answer to the above problem. This is now explained with reference to the three signal timing diagrams which are shown schematically in FIGS. 9A, 9B and 9C and which represent a second exemplary embodiment of a control method based on the invention. The time sequence of the precharge control signals EQL1, EQL2, EQL3, EQL4 and of the shorting control signal EQLx, as shown in FIG. 9A, is just as in the first exemplary embodiment of the inventive control method, which was explained above with reference to FIG. 7.

Figure 9B:
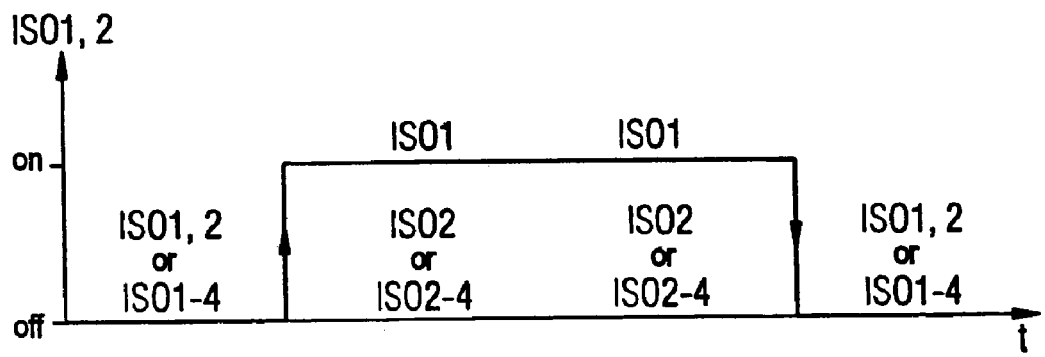

FIG. 9B shows that, in a departure from the first exemplary embodiment of the RAM store control method, as shown in FIG. 7B, the isolation transistors 1, 2 are never open together. The intact bit line pair in question, for example 21, is connected from the corresponding isolation transistors 1 and 2 to the sense amplifier SA only during the activation phase ②, that is to say during a sensing operation and the subsequent precharge operation in line with phase ③ up to the next activation command on the same bank in line with phase ④. The bit line pair (for example 22) not addressed in the example, repaired by a redundant bit line pair, is not connected to the intact bit line pair, e.g. 21, via the sense amplifier SA on account of its deactivated isolation transistors 1, 2, and thus cannot influence said intact bit line pair. Even when there is directly consecutive activation of the repaired bit line pair, e.g. 22, and the intact bit line pair 21, the shifted center level of the faulty bit line pair, e.g. 22, has no reaction on the intact bit line pair, e.g. 21, since the isolation transistors 1, 2 of the two bit line pairs are never open together.

Since the critical precharge time is determined, as also previously, by fresh activation for the bit lines spread last, the critical precharge time for the chip is not impaired by the inventive RAM store which has been explained above and is shown in FIGS. 4 to 6. The positive support for the second bit line pair already in precharge (via the connected isolation transistors 1, 2) in the precharge phase is consciously dispensed with in the second exemplary embodiment of the control method. This effect could slightly impair the inventive RAM store's $t_{RP}$ as compared with the previous RAM stores. However, in previous RAM stores too, there are sense amplifiers in the marginal area of the chip which do not experience this support and therefore have a comparatively critical $t_{RP}$, as in the case of the inventive RAM store.

Mention is still to be made of the fact that, in the above description of the second exemplary embodiment of the inventive control method, the starting point taken for FIG. 9 by way of example was an intact bit line pair (e.g. 21) and a faulty bit line pair (for example 22) repaired by a redundant bit line pair.

Figure 9C:
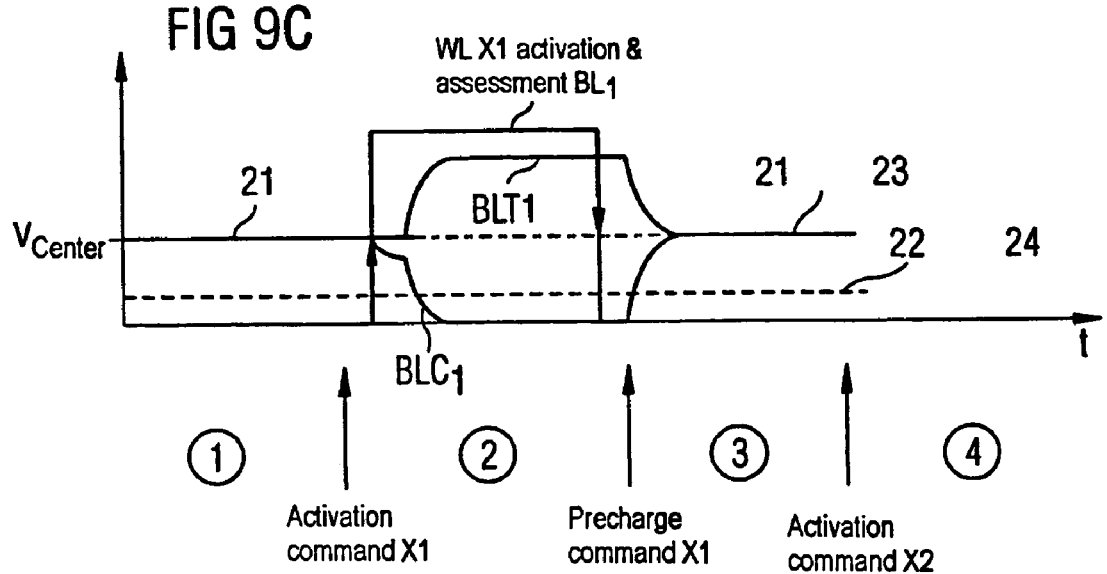

The method steps described with reference to FIGS. 9A, 9B and 9C for two bit line pairs using a common sense amplifier SA can also be extended to the shared SA structure shown in FIG. 6, where four bit line pairs use a common sense amplifier SA.

Accordingly, in line with a first fundamental aspect, a generic type RAM store having a shared SA structure is characterized, in line with the invention, in that the shorting transistor is arranged in or on the respective sense amplifier jointly for all bit line pairs which can be connected to a respective sense amplifier, and it can be switched by a separate shorting control signal via a dedicated control line.

In line with a second fundamental aspect, a method (which achieves the above object) for controlling a RAM store which is designed using a shared SA structure and generates a connection control signal for connecting sense amplifiers arranged between two adjacent cell blocks to a respective one of a plurality of bit line pairs from the adjacent cell blocks and generates a precharge control signal for the purpose of performing, in a precharge phase, a charge equalization between the bit line halves of the bit line pairs associated with the same sense amplifier and connecting the bit line halves to one another is characterized, in line with the invention, in that the bit line halves of the bit line pairs associated with the same sense amplifier are shorted by means of a shorting transistor arranged in/on each sense amplifier, and this is done by supplying this shorting transistor with a dedicated shorting control signal. This shorting control signal is thus separate from the precharge control signal which ensures charge equalization for the individual bit line pairs.

One embodiment of this control method is characterized in that in the activation phase for a particular bit line pair, the latter's precharge control signal and the shorting control signal which is supplied to the shorting transistor in/on the sense amplifier are deactivated and only the connection control signal for this bit line pair is activated, and in that in the precharge phase which comes directly after this activation phase and in which none of the bit line pairs associated with the sense amplifier has been activated, the connection control signals for connecting the bit line halves of all bit line pairs associated with this sense amplifier are generated and the shorting transistor is supplied with the shorting control signal, and the bit line halves of all these bit line pairs are supplied with a center level.

In a second alternative embodiment, the inventive control method is characterized in that for a redundancy design, in which a faulty bit line pair is replaced by a redundant bit line pair, both the precharge control signal for the intact bit line pair and the shorting control signal supplied to the shorting transistor in the sense amplifier are deactivated in the activation phase for an intact bit line pair among the bit line pairs associated with the same sense amplifier, and only the connection control signal for this intact bit line pair is activated, and, in the precharge phase which follows the activation phase and in which none of the bit line pairs associated with this sense amplifier has been activated, the connection control signal is activated exclusively for the previously activated, intact bit line pair up until the next activation command on the same bank, the shorting control signal for the shorting transistor is activated and the precharge control signals are activated.

As already mentioned, in one exemplary embodiment, a respective bit line pair from a left-hand and a right-hand adjacent cell block, that is to say a total of two bit line pairs, can be connected to the same sense amplifier. In an alternative exemplary embodiment, two respective bit line pairs from a left-hand and a right-hand adjacent cell block, that is to say a total of four bit line pairs, can be connected to the same sense amplifier. In the case of a double shared sense amplifier, a RAM store based on the invention saves the surface area for a shorting transistor, and in the case of a quadruple shared sense amplifier the invention affords the advantage of saving three shorting transistors. However, in the RAM store based on the invention, the additional control line is routed in the sense amplifier strip and uses the separate shorting control signal to switch all the shorting transistors in one SA strip.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

What is claimed is:

1. A RAM store having a shared sense amplifier (SA) structure, in which
   sense amplifiers (SA) arranged in SA strips between two respective adjacent cell blocks are used by a plurality of bit line pairs from the adjacent cell blocks, and
   the bit line pairs have respective charge equalization circuits individually associated with them and perform, upon applying a respective precharge control signal, charge equalization between the bit line halves of the respective bit line pairs in a precharge phase.
   wherein
   a shorting transistor is arranged in or on a respective sense amplifier (SA) jointly for all bit line pairs that can be connected to the respective sense amplifier, said shorting transistor being provided to connect, at the sense amplifier, the bit line halves of the bit line pairs that are in the precharge phase to one another when the shorting transistor is switched by a separate shorting control signal via a dedicated control line that is separate from the precharge control signal performing the charge equalization between the bitline halves of the respective bitline pairs.

2. The RAM store as in claim 1, wherein a respective sense amplifier can be connected to a respective one of two bit line pairs from a left-hand and a right-hand adjacent cell block.

3. The RAM store as in claim 1, wherein a respective sense amplifier can be connected to a respective one of four bit lines pairs from a left-hand and a right-hand adjacent cell block.

4. The RAM store as in claim 1, wherein the separate shorting control signal supplied via the control line dedicated to the shorting transistors switches all of the shorting transistors in an SA strip.

5. A method for controlling a RAM store having the design of a shared SA structure, in which sense amplifiers arranged in SA strips between two respective adjacent cell blocks are respectively used by a plurality of bit line pairs from the adjacent cell blocks, comprising:
   generating a connection control signal separately for each of the bit line pairs associated with the same sense amplifier for connecting the sense amplifier to the respective bit line pair actuated by the connection control signal; and
   generating a precharge control signal for performing charge equalization between the bit line halves of the bit line pairs associated with the same sense amplifier in a precharge phase,
   wherein the bit line halves of the bit line pairs associated with the same sense amplifier are shorted, when these bit lines pairs are in the precharge phase on account of the precharge control signal supplied to them, by means of a shorting transistor arranged in or on each sense amplifier by supplying this shorting transistor with a dedicated shorting control signal.

6. The control method for a RAM store as in claim 5, wherein in the activation phase for a particular bit line pair, the latter's precharge control signal and the shorting control signal that is supplied to the shorting transistor are deactivated and only the connection control signal for this bit line pair is activated, and
   wherein in the precharge phase that comes directly after this activation phase and in which none of the bit line pairs associated with the sense amplifier has been activated, the connection control signals for connecting the bit line halves of all bit line pairs associated with this sense amplifier are generated and the shorting transistor is supplied with the shorting control signal, and the bit line halves of all of these bit line pairs are supplied with a center level.

7. The control method for a RAM store as in claim 5, wherein for a redundancy design, in which a faulty bit line pair is replaced by a redundant bit line pair, both the precharge control signal for the intact bit line pair and the shorting control signal supplied to the shorting transistor are deactivated in the activation phase for an intact bit line pair among the bit line pairs associated with the same sense amplifier and only the connection control signal is activated, and, in the precharge phase which follows this activation phase and in which none of the bit line pairs associated with this sense amplifier has been activated, the connection control signal is activated exclusively for the previously activated, intact bit line pair up until the next activation command on the same bank, the shorting control signal for the shorting transistor is activated and the bit line halves of all bit line pairs associated with this sense amplifier have the same center level applied to them.

8. The control method for a RAM store as in claim 5, wherein the connection control signal respectively connects one of two bit line pairs from the adjacent cell blocks to the respective sense amplifier in a bit line assessment phase.

9. The control method for a RAM store as in claim 5, wherein the connection control signal respectively connects one of four bit line pairs from the adjacent cell blocks to the respective sense amplifier in a bit line assessment phase.

10. A memory device comprising:
   a first bitline pair including a first bitline half and a second bitline half;
   a first equalization circuit coupled between the first bitline half and the second bitline half;
   a second bitline pair including a first bitline half and a second bitline half;
   a second equalization circuit coupled between the first bitline half and the second bitline half;
   a sense amplifier having a first line coupled to the first bitline half of the first bitline pair and first bitline half of the second bitline pair and a first line coupled to the second bitline half of the first bitline pair and second bitline half of the second bitline pair;
   a first isolation transistor pair coupled between the first bitline pair and the sense amplifier;
   a second isolation transistor pair coupled between the second bitline pair and the sense amplifier; and
   a shorting transistor coupled between the first line of the sense amplifier and the second line of the sense amplifier, the shorting transistor located between the first isolation transistor pair and the second isolation transistor pair.

11. The device of claim 10, further comprising:
a first plurality of dynamic random access memory cells coupled to the first bitline; and
a second plurality of dynamic random access memory cells coupled to the second bitline.

12. The device of claim 11, wherein no shorting transistor is included between the first plurality of memory cells and the first isolation transistor pair and wherein no shorting transistor is included between the second plurality of memory cells and the second isolation transistor pair.

13. The device of claim 10, further comprising a first control line coupled to the first equalization circuit and a second control line coupled to the shorting transistor, the second control line separate from the first control line.

14. The device of claim 13, further comprising a third control line coupled to the third equalization circuit, the third control line separate from the first and the second control lines.

15. The device of claim 13, wherein the sense amplifier comprises one sense amplifier in a strip of sense amplifiers, each sense amplifier in the strip including a shorting transistor that is coupled to the second control line.

16. The device of claim 10, further comprising:
a third bitline pair including a first bitline half and a second bitline half;
a third isolation transistor pair coupled between the third bitline pair and the sense amplifier;
a fourth bitline pair including a first bitline half and a second bitline half; and
a fourth isolation transistor pair coupled between the fourth bitline pair and the sense amplifier.

17. The device of claim 16, further comprising:
a third equalization circuit coupled between the first bitline half and the second bitline half of the third bitline pair; and
a fourth equalization circuit coupled between the first bitline half and the second bitline half of the fourth bitline pair.

* * * * *